(12) United States Patent
Nishiura et al.

(10) Patent No.: US 12,547,162 B2
(45) Date of Patent: Feb. 10, 2026

(54) SUBSTRATE PROCESSING APPARATUS, SWITCHING METHOD, METHOD OF MANUFACTURING SEMICONDUCTOR DEVICE, AND RECORDING MEDIUM

(71) Applicant: Kokusai Electric Corporation, Tokyo (JP)

(72) Inventors: Susumu Nishiura, Toyama (JP); Hajime Abiko, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 425 days.

(21) Appl. No.: 18/088,965

(22) Filed: Dec. 27, 2022

(65) Prior Publication Data

US 2023/0221699 A1 Jul. 13, 2023

(30) Foreign Application Priority Data

Jan. 12, 2022 (JP) .................................. 2022-003149

(51) Int. Cl.
  G05B 19/418 (2006.01)
  H01L 21/677 (2006.01)
(52) U.S. Cl.
  CPC .... *G05B 19/4189* (2013.01); *H01L 21/67769* (2013.01); *G05B 2219/45031* (2013.01)
(58) Field of Classification Search
  None
  See application file for complete search history.

(56) References Cited

U.S. PATENT DOCUMENTS

| | | | |
|---|---|---|---|
| 6,582,174 B1 | 6/2003 | Hayashi | |
| 2009/0053665 A1 | 2/2009 | Haraki et al. | |
| 2017/0178935 A1 | 6/2017 | Morikawa et al. | |
| 2018/0265294 A1 | 9/2018 | Hayashi | |
| 2019/0096728 A1 | 3/2019 | Iwamoto et al. | |
| 2019/0189490 A1 | 6/2019 | Morita et al. | |
| 2019/0362995 A1 | 11/2019 | Ito et al. | |

FOREIGN PATENT DOCUMENTS

| | | | |
|---|---|---|---|
| JP | 2000-216212 A | 8/2000 | |
| JP | 2006-120658 A | 5/2006 | |
| JP | 2020-161804 A | 10/2020 | |

(Continued)

OTHER PUBLICATIONS

Korean Office Action issued on Oct. 17, 2024 for Korean Patent Application No. 10-2022-0183908.

(Continued)

*Primary Examiner* — Sean Shechtman
(74) *Attorney, Agent, or Firm* — Volpe Koenig

(57) ABSTRACT

There is provided a technique that includes at least one load port capable of mounting a substrate storage container that stores a substrate, a controller configured to be capable of performing: a switching control to switch a first function of using the at least one load port to load or unload the substrate storage container and a second function of mounting the substrate storage container on the at least one load port; and an erroneous operation prevention control to execute an erroneous operation prevention operation to the substrate storage container arranged on the at least one load port according to use modes associated with the first function and the second function; and a process chamber configured to process the substrate.

12 Claims, 10 Drawing Sheets

(56) References Cited

FOREIGN PATENT DOCUMENTS

| KR | 10-2019-0036502 A | 4/2019 |
| KR | 10-2019-0074995 A | 6/2019 |
| KR | 10-2019-0134523 A | 12/2019 |

OTHER PUBLICATIONS

Taiwan Office Action issued on Feb. 29, 2024 for Taiwan Patent Application No. 111147530.
European Search Report issued on Jun. 6, 2023 for European Patent Application No. 22216946.8.

SUBSTRATE PROCESSING APPARATUS, SWITCHING METHOD, METHOD OF MANUFACTURING SEMICONDUCTOR DEVICE, AND RECORDING MEDIUM

CROSS-REFERENCE TO RELATED APPLICATION

This application is based upon and claims the benefit of priority from Japanese Patent Application No. 2022-003149, filed on Jan. 12, 2022, the entire contents of which are incorporated herein by reference.

TECHNICAL FIELD

The present disclosure relates to a substrate processing apparatus, a switching method, a method of manufacturing a semiconductor device, and a recoding medium.

BACKGROUND

As a substrate processing apparatus used in one of processes of manufacturing a semiconductor device, there is known an apparatus configured so that a plurality of substrate storage containers called FOUPs (Front Opening Unified Pods) is accommodated in storage racks (mounting racks) provided in the apparatus.

SUMMARY

Some embodiments of the present disclosure provide a technique capable of flexibly and appropriately coping with a change in the storage number of substrate storage containers.

According to one embodiment of the present disclosure, there is provided a technique that includes at least one load port capable of mounting a substrate storage container that stores a substrate, a controller configured to be capable of performing: a switching control to switch a first function of using the at least one load port to load or unload the substrate storage container and a second function of mounting the substrate storage container on the at least one load port; and an erroneous operation prevention control to execute an erroneous operation prevention operation to the substrate storage container arranged on the at least one load port according to use modes associated with the first function and the second function; and a process chamber configured to process the substrate.

BRIEF DESCRIPTION OF DRAWINGS

The accompanying drawings, which are incorporated in and constitute a part of the specification, illustrate embodiments of the present disclosure.

FIG. 3A is a perspective view of the configuration example, FIG. 3B is a top view of the configuration example, and FIG. 3C is a front view of the configuration example.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments of the present disclosure will be described with reference to the drawings.

A substrate processing apparatus exemplified in the following description is used in a semiconductor device manufacturing process, and is configured to perform a predetermined process on a substrate to be processed. The substrate to be processed is, for example, a silicon wafer (hereinafter simply referred to as "substrate") as a semiconductor substrate on which a semiconductor device is built. The term "substrate" used herein may refer to "a substrate itself" or "a stacked body (aggregate) of a substrate and a predetermined layer or film formed on the surface of the substrate" (That is, the substrate including a predetermined layer or film formed on the surface thereof may be referred to as substrate). The phrase "a surface of a substrate" used herein may refer to "a surface (exposed surface) of a substrate itself" or "a surface of a predetermined layer, film, or the like formed on a substrate, i.e., an outermost surface of a substrate as a stacked body." The term "wafer" used herein is synonymous with the term "substrate." Examples of a predetermined process (hereinafter sometimes simply referred to as "process") performed on a substrate include an oxidation process, a diffusion process, an annealing process, an etching process, a pre-cleaning process, a chamber cleaning process, a film-forming process, and the like. In the present embodiment, a case where a film-forming process is performed will be taken as an example.

(1) Overall Configuration of Substrate Processing Apparatus

Figure 1:
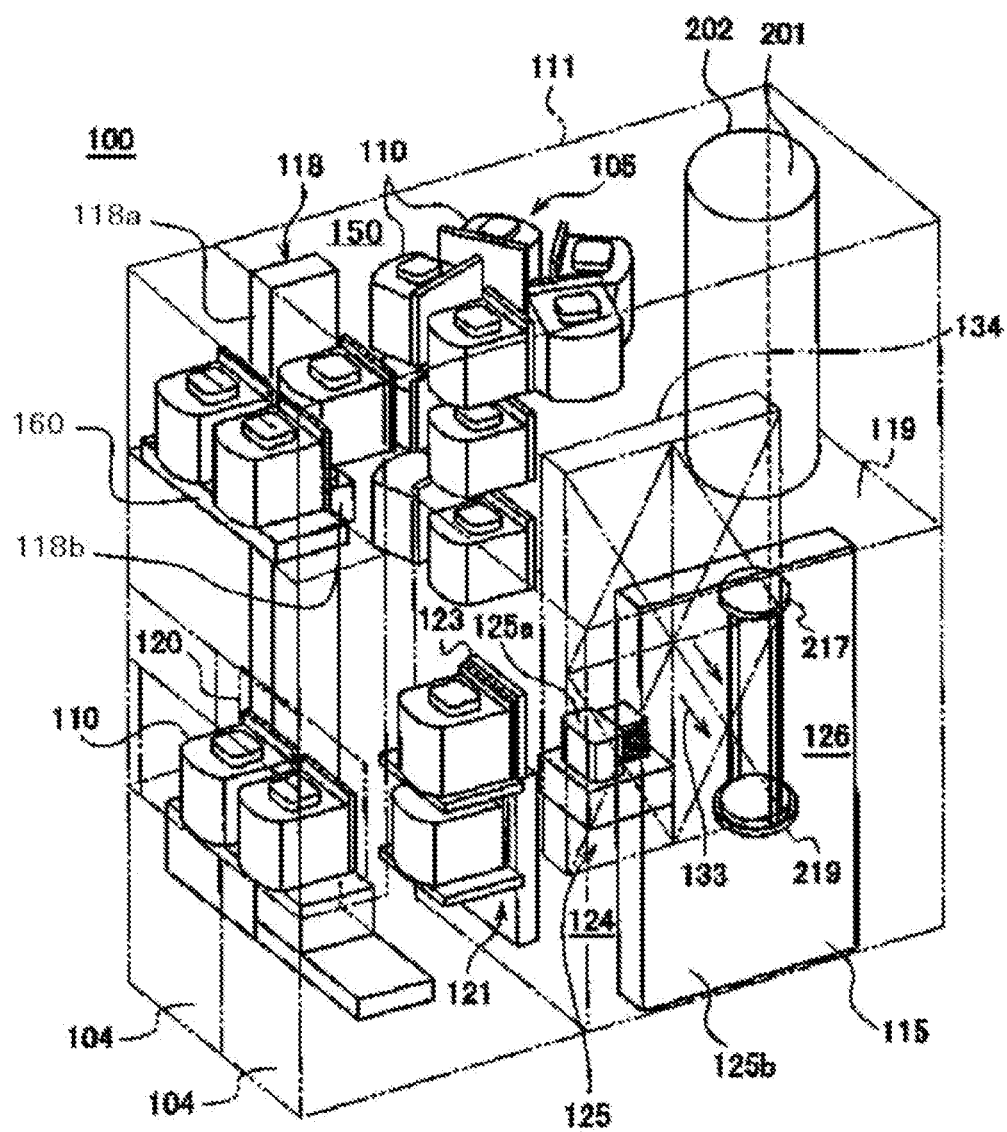
FIG. 1 is a perspective view showing a configuration example of a substrate processing apparatus according to one embodiment of the present disclosure.
Figure 2:
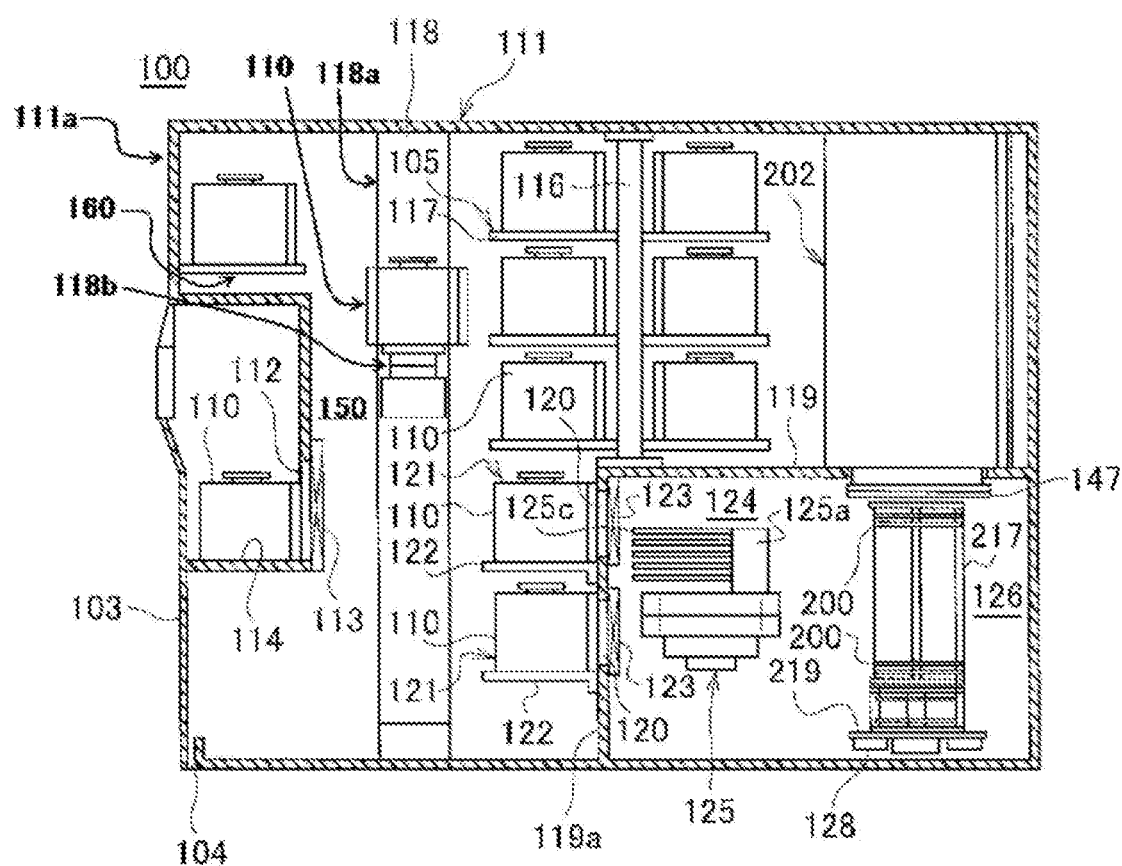
FIG. 2 is a side perspective view showing the configuration example of the substrate processing apparatus according to one embodiment of the present disclosure.

An overall configuration of a substrate processing apparatus according to one embodiment of the present disclosure will be described with reference to FIGS. 1 and 2. FIG. 1 is a perspective view showing a configuration example of the substrate processing apparatus according to the present embodiment. FIG. 2 is a perspective side view showing a configuration example of the substrate processing apparatus according to the present embodiment.

As shown in FIGS. 1 and 2, in the substrate processing apparatus 100 described here as an example, a pod 110 as a wafer carrier (substrate storage container) that stores a plurality of wafers 200 is used if wafers 200 serving as substrates are transferred into and out of the apparatus. The pod 110 may be, for example, a FOUP.

Since the pod 110 is used, the substrate processing apparatus 100 is provided with a lower load port 114 and an upper load port 160 on the side of a front wall 111a of an apparatus housing 111. Each of the plurality of load ports 114 and 160 functions as a substrate storage container delivery table that enables loading or unloading of the pod 110 which stores the wafers 200. Each of the plurality of load ports 114 and 160 is configured so that the pod 110 transferred by an in-process transfer (not shown) or manually can be mounted thereon.

Each of the load ports 114 and 160 is configured so that a plurality of (e.g., two) pods 110 can be mounted thereon. Each of the load ports 114 and 160 is provided with a pod clamping mechanism (not shown) to hold the pod 110 mounted thereon. The configuration of the pod clamping mechanism will be described later.

A substrate storage container transfer chamber 150 serving as a transfer space for the pod 110 is formed in the apparatus housing 111 on a rear side of each of the load ports 114 and 160. In the substrate storage container transfer chamber 150, a pod transfer (substrate storage container transfer) 118 and a rotary pod shelf (substrate storage container mounting shelf) 105 are installed.

The pod transfer 118 includes a pod elevator (substrate storage container elevating mechanism) 118a capable of moving up or down while holding the pod 110, and a pod transfer mechanism (substrate storage container transfer mechanism) 118b as a transfer mechanism. The pod transfer 118 is configured to transfer the pod 110 between the load port 114, the pod shelf 105, and the pod opener 121, which will be described later, by continuous operation of the pod elevator 118a and the pod transfer mechanism 118b.

The pod shelf 105 includes a plurality of shelf plates (substrate storage container mounting tables) 117 and a column 116 that stands vertically and intermittently rotates in a horizontal plane. The pod shelf 105 is configured to function as a container mounting shelf capable of storing a plurality of pods 110 in the apparatus housing 111 by mounting the pod 110 on each shelf plate 117 while intermittently rotating the column 116.

A sub-housing 119 is installed below the apparatus housing 111 over a region from a substantially central portion of the apparatus housing 111 in a front-rear direction to a rear end thereof. A pair of wafer loading/unloading ports (substrate loading/unloading ports) 120 for transferring wafers 200 into and out of the sub-housing 119 are arranged vertically in two stages on the front wall 119a of the sub-housing 119. A pod opener (substrate storage container opening/closing part) 121 is installed at each of the upper and lower wafer loading/unloading ports 120.

Each pod opener 121 includes a pair of mounting tables 122 on which the pod 110 is mounted, and a cap attaching/detaching mechanism (lid attaching/detaching mechanism) 123 for attaching and detaching the cap (lid) of the pod 110. The pod opener 121 is configured to open and close the wafer loading/unloading port of the pod 110 by attaching and detaching the cap of the pod 110 mounted on the mounting table 122 by means of the cap attaching/detaching mechanism 123.

In the sub-casing 119, a transfer chamber 124 is configured as a substrate transfer chamber that is fluidly isolated from the space in which the pod transfer 118, the pod shelf 105, and the like are installed. A wafer transfer mechanism (substrate transfer mechanism) 125 is installed in the front region of the transfer chamber 124. The wafer transfer mechanism 125 includes a wafer transfer (substrate transfer) 125a capable of horizontally rotating or linearly moving the wafer 200, and a wafer transfer elevator (substrate transfer elevating mechanism) 125b (see FIG. 1) configured to raise or lower the wafer transfer 125a. The wafer transfer elevator 125b is installed between a right end of a front region of the transfer chamber 124 of the sub-housing 119 and the right end of the housing 111 (see FIG. 1). The wafer transfer 125a includes a tweezer (substrate holder) 125c as a mounter for the wafer 200. The wafers 200 are charged to and discharged from the boat (substrate holder) 217 by the continuous operation of the wafer transfer elevator 125b and the wafer transfer 125a.

A standby part 126 that accommodates the boat 217 and keeps the boat 217 in a standby state is installed in a rear region of the transfer chamber 124. A process container 202 for processing wafers 200 is provided above the standby part 126. A lower end portion of the process container 202 is configured to be opened or closed by a furnace port shutter (a furnace port opening/closing mechanism) 147. The configuration of the process container 202 will be described later.

A boat elevator (substrate holder elevating mechanism) 115 for raising or lowering the boat 217 is installed between the right end of the standby part 126 of the sub-housing 119 and the right end of the housing 111 (see FIG. 1). An arm 128 as a connector is connected to the elevating table of the boat elevator 115. A seal cap 219 as a furnace port lid is horizontally attached to the arm 128. The seal cap 219 is configured to vertically support the boat 217 and close the lower end of the process container 202.

The boat 217 is configured to horizontally hold a plurality of (e.g., about 50 to 125) wafers 200 in a vertically aligned state with their centers coinciding with each other.

As shown in FIG. 1, at the left end of the transfer chamber 124 opposite to the wafer transfer elevator 125b side and the boat elevator 115 side, a cleaner 134 including a supply fan and a dust filter is installed so as to supply a cleaned atmosphere or a clean air, which is an inert gas. The clean air 133 blown out from the cleaner 134 circulates around the notch aligner, the wafer transfer 125a, and the boat 217 on the standby part 126. Then, the clean air 133 is sucked into a duct and exhausted to the outside of the housing 111, or is circulated to the primary side (supply side), which is the suction side of the cleaner 134, and blown out again into the transfer chamber 124 by the cleaner 134.

(2) Configuration of Pod Clamping Mechanism

Figure 3A:
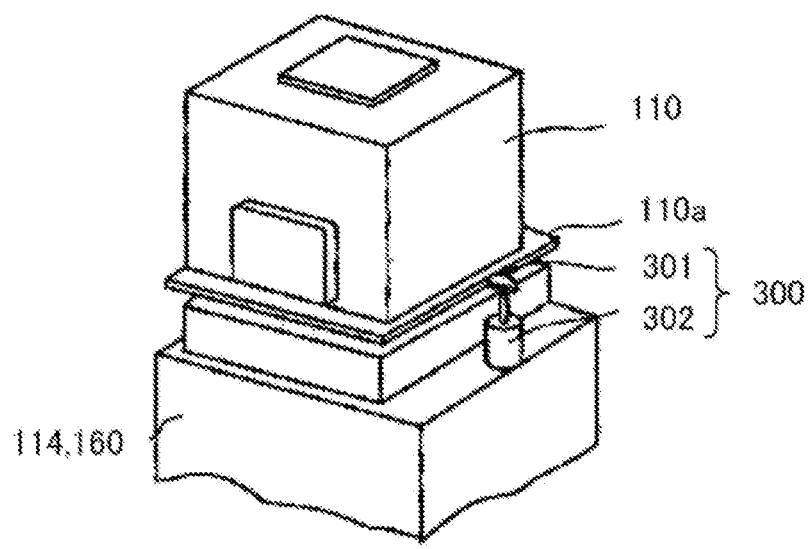
FIGS. 3A, 3B and 3C are explanatory diagrams showing a configuration example of a pod clamp mechanism installed in a load port of the substrate processing apparatus according to one embodiment of the present disclosure, where
Figure 3B:
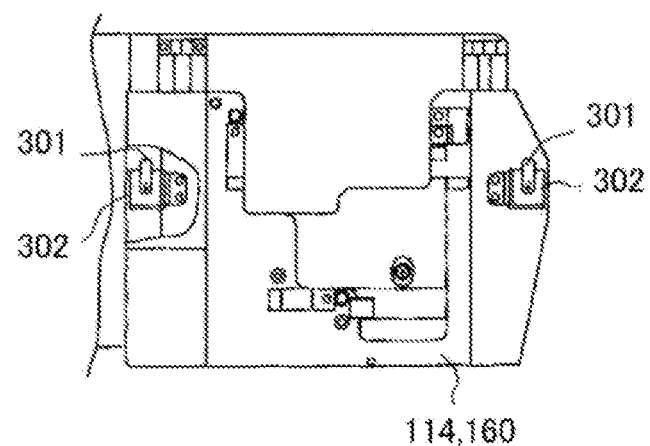
Figure 3C:
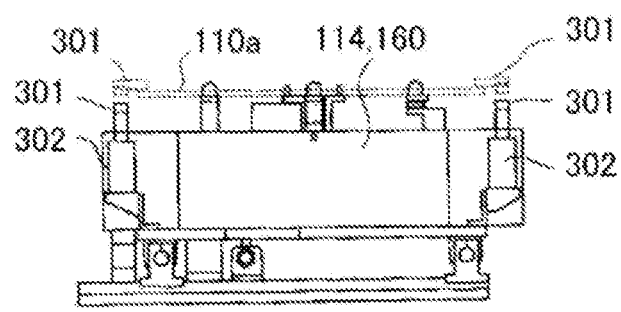

Next, the configuration of the pod clamping mechanism provided for each of the load ports 114 and 160 will be described with reference to FIGS. 3A, 3B, and 3B. FIGS. 3A, 3B, and 3C are an explanatory diagram showing a configuration example of the pod clamping mechanism provided in the load port of the substrate processing apparatus according to the present embodiment.

As shown in FIGS. 3A, 3B, and 3C, the pod clamping mechanism 300 that holds the pod 110 in place is installed on each of the load ports 114 and 160. The pod clamping mechanism 300 includes locking claw portions 301 configured to lock the lower base 100a of the pod 110, air cylinders 302 which are means for moving the locking claw portions 301 up and down, and rotator (not shown) configured to rotate the locking claw portions 301 using motors or the like.

When the pod 110 is mounted on each of the load ports 114 and 160 on which the pod clamping mechanism 300 having such a configuration is installed, the locking claw portions 301 arranged near both ends of each of the load ports 114 and 160 are moved upward by the air cylinders 302 and then rotated 90 degrees by the rotator. Thus, the locking claw portions 301 is hooked to the lower base 100a of the pod 110. As a result, the pod 110 is held by the pod clamping mechanism 300 and can be prevented from being dropped or taken out from each of the load ports 114 and 160.

According to the pod clamping mechanism 300 having such a configuration, the locking claw portions 301 are arranged outside the pod 110. Therefore, the locking claw portions 301 do not interfere with the transfer that transfers the pod 110, whereby the pod 110 can be held on each of the load ports 114 and 160 without disturbing the operation of the transfer. In the pod clamping mechanism 300 of the present embodiment, the pod 110 is held using the single-axis cylinder. Therefore, the structure of the pod clamping mechanism 300 is simple and the cost thereof is low. Since the locking claw portions 301 are arranged outside the pod 110, it is easy to check the operation and holding of the locking claw portions 301.

The height and width of the base 110a of the pod 110 differ depending on the manufacturer, the type of the pod 110, and the like. In the present embodiment, these problems can be addressed by providing adjustment parts in the respective directions. For example, the height of the locking claw portions 301 is adjusted in a height direction, and the installation positions of the locking claw portions 301 and the air cylinders 302 are adjusted in a width direction.

(3) Configuration of Process Container

Figure 4:
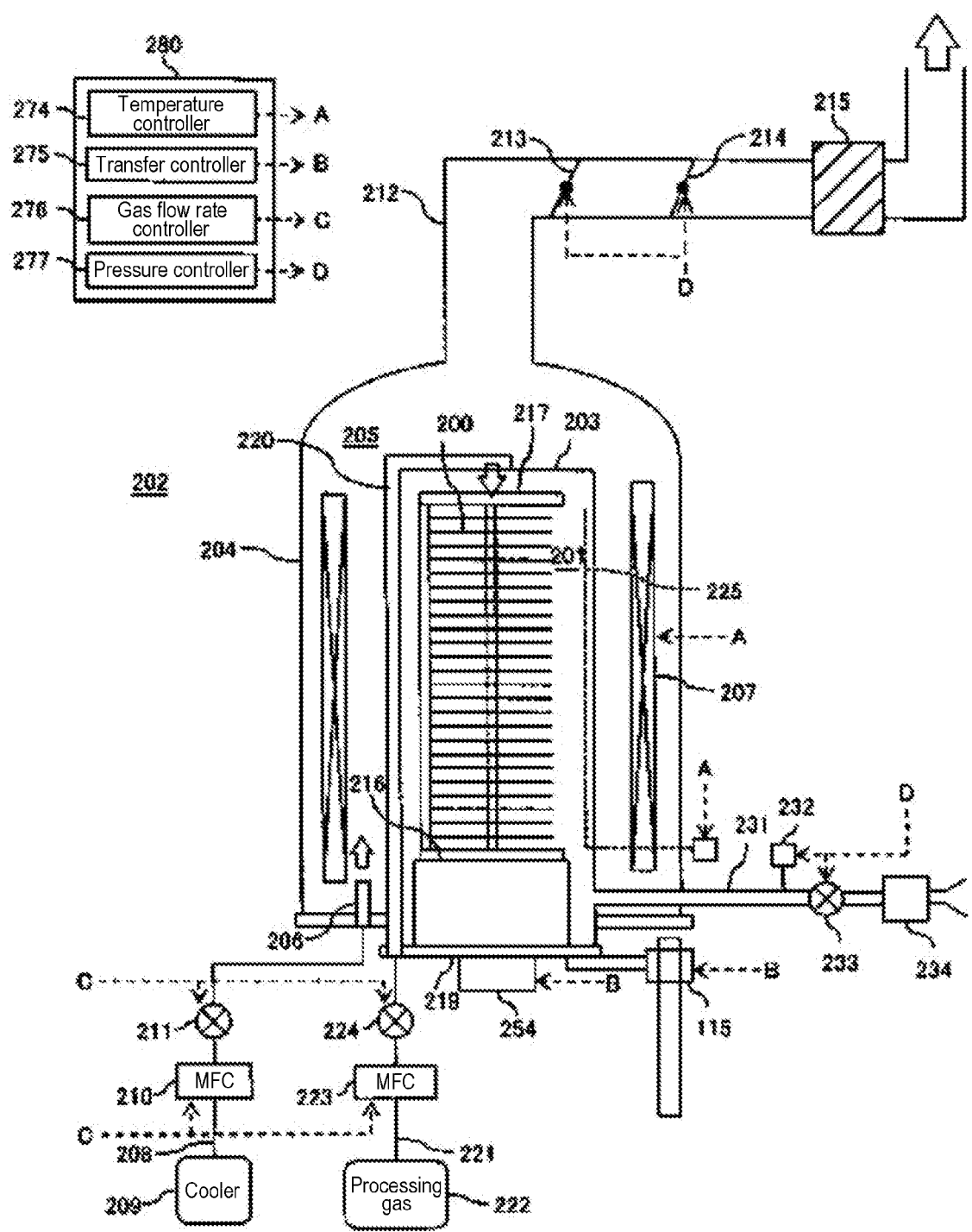
FIG. 4 is a vertical sectional view showing a configuration example of a process container included in the substrate processing apparatus according to one embodiment of the present disclosure.

Next, the configuration of the process container 202 in the substrate processing apparatus 100 will be described with reference to FIG. 4. FIG. 4 is a vertical sectional view showing a configuration example of the process container included in the substrate processing apparatus according to the present embodiment.

As shown in FIG. 4, the process container 202 includes a reaction tube 203. The reaction tube 203 is made of a heat-resistant material such as quartz ($SiO_2$) or silicon carbide (SiC), and is formed into a cylindrical shape with open upper and lower ends. A process chamber 201 that processes wafers 200 as substrates is formed in the cylindrical hollow portion of the reaction tube 203. The process chamber 201 is configured to accommodate a boat 217 holding the wafers 200.

The boat 217 as a substrate holder is configured to hold a plurality of wafers 200 in a horizontal posture and in multiple stages with their centers aligned with each other. The boat 217 is made of a heat-resistant material such as, for example, quartz, silicon carbide, or quartz and silicon carbide. A heat insulator 216 made of a heat-resistant material such as, for example, quartz, silicon carbide, or quartz and silicon carbide is installed below the boat 217. This makes it difficult for the heat to be transferred from the heater 207, which will be described later, to the seal cap 219.

Below the reaction tube 203, a seal cap 219 is installed as a furnace port lid capable of hermetically closing the lower end opening of the reaction tube 203. The seal cap 219 abuts against the lower end of the reaction tube 203 from below in a vertical direction. The seal cap 219 is made of a metal such as stainless steel, and is formed into a disc-like shape. An O-ring is provided on an upper surface of the seal cap 219 as a seal that contacts the lower end of the reaction tube 203. As described above, the seal cap 219 is configured to be vertically raised or lowered by the boat elevator 115 as an elevating mechanism installed vertically outside the reaction tube 203. The boat 217 can be transferred into and out of the process chamber 201 by raising or lowering the seal cap 219.

A boat rotator 254 for rotating the boat 217 is installed near the center of the seal cap 219 and on the side opposite to the process chamber 201. The rotary shaft of the boat rotator 254 penetrates the seal cap 219 and supports the boat 217 from below. The boat rotator 254 is configured to rotate the wafers 200 by rotating the boat 217.

A transfer controller 275 is electrically connected to the boat rotator 254 and the boat elevator 115. The transfer controller 275 is configured to control the boat rotator 254 and the boat elevator 115 so that they perform desired operations at desired timings. The transfer controller 275 is also electrically connected to the pod elevator 118a, the pod transfer mechanism 118b, the pod opener 121, the wafer transfer 125a, the wafer transfer elevator 125b, and the like, and is configured to control these components so that they perform desired operations at desired timings. A transfer system according to the present embodiment is mainly composed of the boat elevator 115, the rotation mechanism 253, the pod elevator 118a, the pod transfer mechanism 118b, the pod opener 121, the wafer transfer 125a, and the wafer transfer elevator 125b.

A heater 207 as a heating part for heating the wafers 200 in the reaction tube 203 is installed outside the reaction tube 203 so as to surround the side wall surface of the reaction tube 203. The heater 207 is formed into a cylindrical shape and is vertically installed by being supported by a heater base as a holding plate.

A temperature sensor 225 such as a thermocouple or the like is installed in the reaction tube 203 as a temperature detector. A temperature controller 274 is electrically connected to the heater 207 and the temperature sensor 225. The temperature controller 274 is configured to adjust the electric power supplied to the heater 207 based on the temperature information detected by the temperature sensor 225 so that the temperature in the process chamber 201 has a desired temperature distribution at a desired timing.

A processing gas supply nozzle 220 is installed between the reaction tube 203 and the heater 207. The processing gas supply nozzle 220 is arranged along the side portion of the outer wall of the reaction tube 203. An upper end (downstream end) of the processing gas supply nozzle 220 is airtightly installed at the top of the reaction tube 203 (the opening formed at the upper end of the reaction tube 203 described above). A plurality of processing gas supply holes is formed on the processing gas supply nozzle 220 positioned at the upper end opening of the reaction tube 203.

A downstream end of a processing gas supply pipe 221 for supplying a processing gas is connected to the upstream end of the processing gas supply nozzle 220. A processing gas supply source 222, a mass flow controller (MFC) 223 as a flow rate controller, and a valve 224 as an opening/closing valve are connected to the processing gas supply pipe 221 sequentially from the upstream side.

A gas flow rate controller 276 is electrically connected to the MFC 223. The gas flow rate controller 276 is configured to control the MFC 223 so that the flow rate of the gas supplied into the process chamber 201 reaches a desired flow rate at a desired timing.

A processing gas supply system is mainly composed of the processing gas supply pipe 221, the MFC 223 and the valve 224. The processing gas supply nozzle 220 and the processing gas supply source 222 may be included in the processing gas supply system.

The upstream end of an exhaust pipe 231 that exhausts the atmosphere in the reaction tube 203 (process chamber 201) is connected to the reaction tube 203. A pressure sensor 232 as a pressure detector (pressure detection part) that detects the pressure in the process chamber 201, an APC (Auto Pressure Controller) valve 233 as a pressure regulator, and a vacuum pump 234 as a vacuum-exhauster are installed on the exhaust pipe 231 sequentially from the upstream side. The APC valve 233 is an opening/closing valve that can be opened and closed to vacuum-exhaust the reaction tube 203 and stop the vacuum-exhaustion and can adjust the valve opening degree to regulate the pressure in the reaction tube 203.

A pressure controller 277 is electrically connected to the APC valve 233 and the pressure sensor 232. The pressure controller 277 is configured to control the APC valve 233 based on the pressure value detected by the pressure sensor 232 so that the pressure in the process chamber 201 reaches a desired pressure at a desired timing.

A processing gas exhauster is mainly composed of the exhaust pipe 231, the pressure sensor 232 and the APC valve 233. The vacuum pump 234 may be included in the processing gas exhauster.

(4) Configuration of Controller

Figure 5:
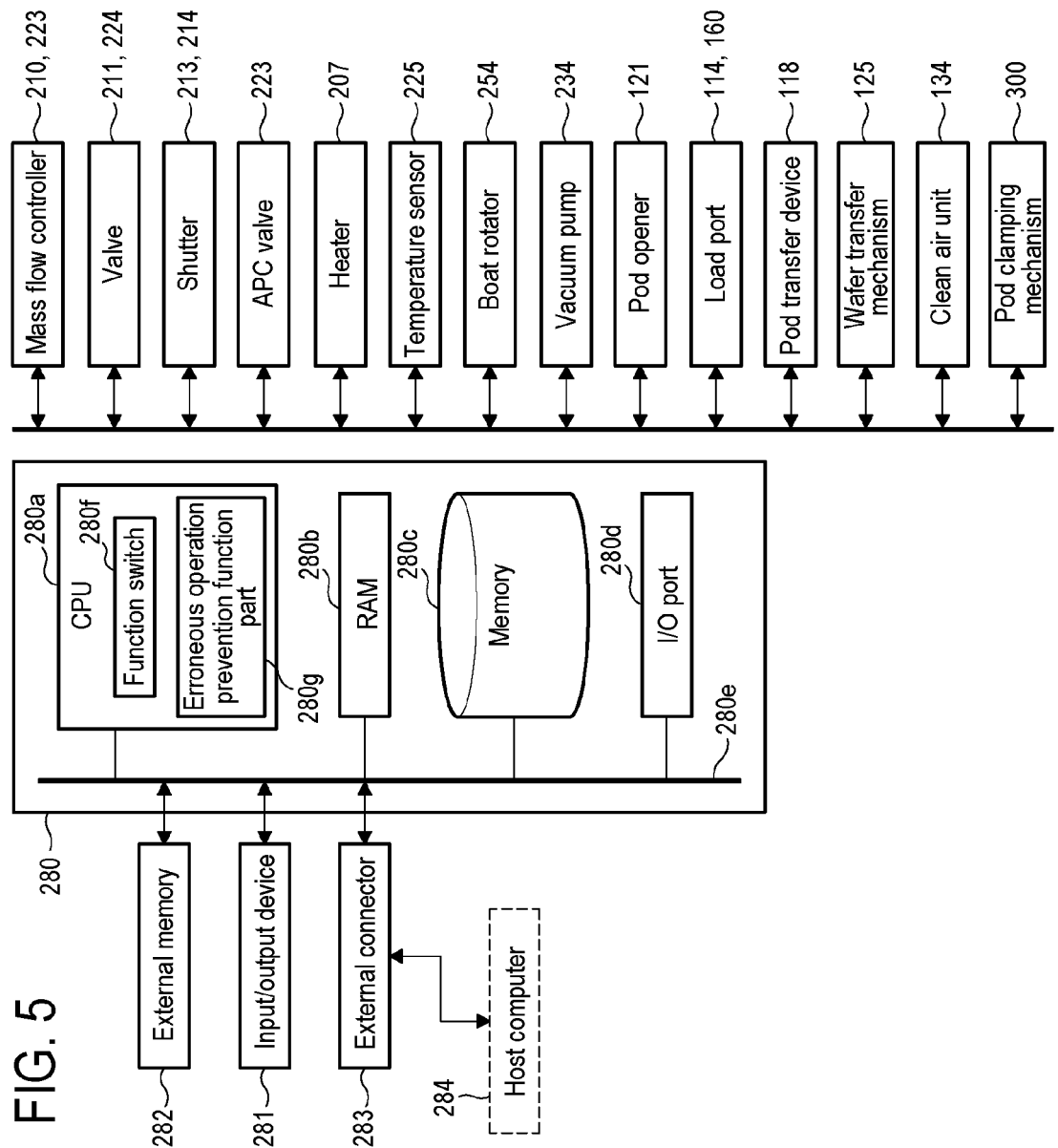
FIG. 5 is a functional block diagram showing a configuration example of a controller included in the substrate processing apparatus according to one embodiment of the present disclosure.

Next, the configuration of the controller 280 that controls the processing operation in the substrate processing apparatus 100 configured as described above will be described with reference to FIG. 5. FIG. 5 is a functional block diagram showing a configuration example of the controller included in the substrate processing apparatus according to the present embodiment.

As shown in FIG. 5, the controller 280, which is a controller (control means), is configured as a computer including a CPU (Central Processing Unit) 280a, a RAM (Random Access Memory) 280b, a memory 280c and an I/O port 280d. The RAM 280b, the memory 280c and the I/O port 280d are configured to exchange data with the CPU 280a via an internal bus 280e. The CPU 280a includes a switching part 280f and an erroneous operation prevention function part 280g.

The memory 280c is composed of, for example, a flash memory, an HDD (Hard Disk Drive), a CD-ROM, or the like. The memory 280c readably stores a control program for controlling the operation of the substrate processing apparatus 100, a process recipe describing procedures and conditions for substrate processing, and the like. The process recipe is a combination that allows the controller 280 to execute each procedure in a below-described substrate processing process to obtain a predetermined result. The process recipe functions as a program. Hereinafter, the process recipe, the control program, and the like are collectively and simply referred to as program. When the term "program" is used in this specification, it may include a recipe, a control program, or both. The RAM 280b is configured as a memory area (work area) in which programs and data read by the CPU 280a are temporarily held.

The I/O port 280d is connected to the mass flow controllers 210 and 223, the valves 21 and 224, the shutters 213 and 214, the APC valve 233, the heater 207, the temperature sensor 225, the boat rotator 254, the vacuum pump 234, the pod opener 121, the load port 114, the pod transfer 118, the wafer transfer mechanism 125, the cleaner 134, the pod clamping mechanism 300, and the like.

The CPU 280a is configured to read a control program from the memory 280c and execute the same, and is configured to read a process recipe from the memory 280c in response to the input of operation commands from the input/output device 281 and the like. The CPU 280a is configured to, according to the content of the process recipe thus read, control the temperature adjustment operation of the heater 207 based on the temperature sensor 225 through a signal line A, the rotation speed adjustment operation of the boat rotator 254 through a signal line B, the flow rate adjustment operation for various gases by the mass flow controllers 210 and 223 through a signal line C, the opening/closing operation of the valves 211 and 224 through a signal line D, the closing operation of the shutters 213 and 214, the opening degree adjustment operation of the APC valve 233, the start/stop of the vacuum pump 234, and the like.

Upon receiving an instruction to switch the use mode of each of the load ports 114 and 160 from a host computer 284 via the input/output device 281 or the external connector 283, the switching part 280f instructs each of the load ports 114 and 160 to switch the use mode according to the content of a use mode switching instruction.

The erroneous operation prevention function part 280g notifies each of the load ports 114 and 160 of the validity or invalidity of an erroneous operation prevention function in accordance with the instruction content of the switching part 280f.

The input/output device 281 is connected to the controller 280. The input/output device 281 functions as an operator to be operated by an operator of the substrate processing apparatus 100, and is composed of, for example, a touch panel, a mouse, a keyboard, an operation terminal, or the like. The input/output device 281 may be configured by a display part such as, for example, a display or the like.

The external connector 283 is also connected to the controller 280. The external connector 283 is used for ensuring connection with an external device, and is configured by, for example, a communication module that performs wireless communication or wired communication with the external device. As the external device connected to the controller 280 via the external connector 283, for example, there is a host computer 284 that functions as a host apparatus for the substrate processing apparatus 100.

The controller 280 is not limited to being configured as a dedicated computer, and may be configured as a general computer. For example, the controller 280 according to the present embodiment can be configured by preparing an external memory (e.g., a magnetic tape, a magnetic disk such as a flexible disk or a hard disk, an optical disk such as a CD or a DVD, a magneto-optical disk such as an MO, and a non-volatile semiconductor memory such as a USB (Universal Serial Bus) memory or a memory card) 282 that stores the above-described program, and installing the program in a general computer using the external memory 282. The means for supplying the program to the computer is not limited to supplying via the external memory 282. For example, the program may be supplied by using a communication means such as the Internet or a dedicated line without having to use the external memory 282. The memory 280c and the external memory 282 are configured as computer-readable recording media. Hereinafter, these are collectively and simply referred to as a recording medium. When the term "recording medium" is used herein, it may include the memory 280c, the external memory 282, or both of them.

(5) Procedure of Substrate Processing Process

Figure 6:
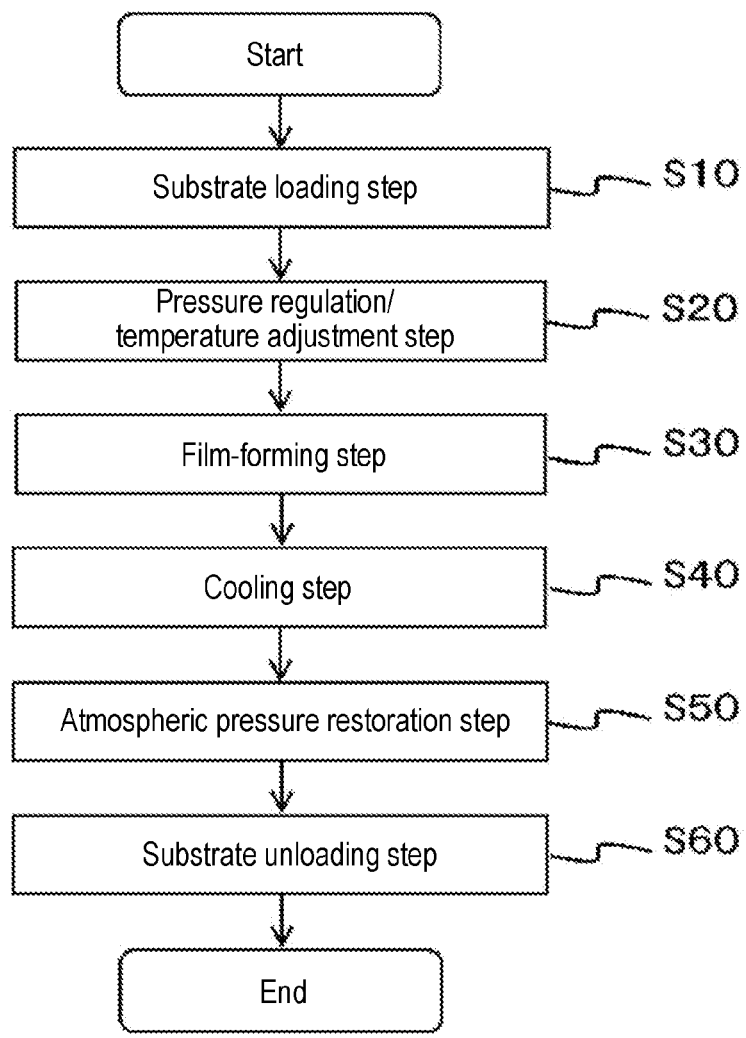
FIG. 6 is a flowchart showing an outline of a substrate processing process according to one embodiment of the present disclosure.

Next, as one of processes of manufacturing a semiconductor device, a substrate processing process for processing a wafer 200 using the substrate processing apparatus 100 having the above-described configuration will be described with reference to FIG. 6. FIG. 6 is a flowchart showing an outline of the substrate processing process according to the present embodiment. As an example, a film-forming process for forming a thin film on a wafer 200 by a CVD (Chemical Vapor Deposition) method will be described. In the following description, the operation of each part of the substrate processing apparatus 100 is controlled by the controller 280.

(Substrate Loading Step (S10))

First, the boat 217 is charged with a plurality of wafers 200 (wafer charging), and the boat 217 holding the plurality of wafers 200 is lifted by the boat elevator 115 and loaded into the reaction tube 203 (the process chamber 201) (boat loading). In this state, the furnace port, which is the lower end opening of the reaction tube 203, is sealed by the seal cap 219.

(Pressure Regulation and Temperature Adjustment Step (S20))

The inside of the process chamber 201 is evacuated by the vacuum pump 234 so as to have a desired pressure (degree of vacuum). At this time, the pressure in the reaction tube 203 is measured by the pressure sensor 232, and the APC valve 233 (opening degree thereof) is feedback-controlled based on the measured pressure value (pressure regulation). Further, the inside of the process chamber 201 is heated by the heater 207 so that the inside of the process chamber 201 reaches a desired temperature (e.g., 500 degrees C. to 1200 degrees C., preferably 1000 degrees C.). At this time, the electric power supplied to the heater 207 is feedback-controlled based on the temperature value detected by the temperature sensor 225 (temperature adjustment).

Further, while heating the inside of the process chamber 201, the boat rotator 254 is operated to start rotating the boat 217, i.e., rotating the wafers 200. At this time, the controller 280 controls the rotation speed of the boat 217. The rotation of the boat 217 by the boat rotator 254 continues at least until the below-describe film-forming step (S30) is terminated.

(Film-Forming Step (S30))

When the inside of the process chamber 201 reaches the desired pressure and temperature, the supply of a processing gas from the processing gas supply pipe 221 into the reaction tube 203 is started. That is, the valve 224 is opened, and the processing gas is supplied from the processing gas supply source 222 into the reaction tube 203 while controlling the flow rate of the processing gas by the MFC 223. As the processing gas passes through the process chamber 201, it contacts a surface of the wafer 200, and a thin film is deposited on a surface of the wafer 200 by a thermal CVD reaction. While supplying the processing gas into the reaction tube 203, the opening degree of the APC valve 233 is adjusted, and the gas is exhausted by the vacuum pump 234. After a predetermined processing time has elapsed, the valve 224 is closed to stop the supply of the processing gas into the reaction tube 203.

(Cooling Step (S40))

After the film-forming step (S30) is terminated, the power supply to the heater 207 is stopped and the cooling step (S40) is started. In the cooling step (S40), for example, a cooling medium is supplied to a cooling medium flow path, and the cooling medium is discharged from the cooling medium flow path. When the temperature of the process container 202 reaches a temperature (e.g., 600 degrees C. or lower, preferably 600 degrees C.) at which the wafers 200 can be unloaded from the process container 202 (process chamber 201), the supply of the cooling medium to the cooling medium flow path is stopped and the cooling step (S40) is terminated.

(Atmospheric Pressure Restoration Step and Substrate Unloading Step (S50 and S60))

After the cooling step (S40) is terminated, the opening degree of the APC valve 233 is adjusted to return the pressure in the process chamber 201 to the atmospheric pressure. Then, the boat 217 is unloaded from the processing chamber 201 by a procedure opposite to the procedure of the substrate loading step described above (boat unloading). Then, the processed wafers 200 are discharged from the boat 217 (wafer discharging) and stored in the pod 110, whereby the substrate processing process according to the present embodiment is completed.

(6) Procedure of Substrate Loading/Unloading Operation

Next, the substrate loading/unloading operation included in the above-described substrate processing process will be described.

(Substrate Loading Operation)

When performing the substrate processing process, the substrate loading operation described below is performed prior to the substrate processing process.

Specifically, when the pod 110 containing the wafers 200 to be processed is supplied to the lower load port 114 or the upper load port 160, the pod 110 on the load port 114 or 160 is loaded into the apparatus housing 111 by the pod transfer 118. Then, the pod 110 is mounted on each shelf plate 117 of the pod shelf 105 and consequently stored on the pod shelf 105.

Thereafter, among the plurality of pods 110 stored on the pod shelf 105, the pod 110 containing the wafers 200 to be film-formed is transferred from the pod shelf 105 onto the mounting table 122 of the pod opener 121 by the pod transfer 118. The opening side end surface of the pod 110 on the mounting table 122 is pressed against the edge of the opening of the wafer loading/unloading port 120 on the front wall 119a of the sub-housing 119, and the cap of the pod 110 is removed by the cap attaching/detaching mechanism 123, so that the wafer loading/unloading port is opened.

When the pod 110 is opened, the wafer 200 is picked up from the pod 110 by the tweezer 125c of the wafer transfer 125a, loaded into the standby part 126 behind the transfer chamber 124, and charged to the boat 217 (charging). After charging the wafer 200 to the boat 217, the wafer transfer 125a returns to the pod 110 and charges the next wafer 200 to the boat 217.

While the wafers 200 are charged from one (upper or lower) pod opener 121 to the boat 217 by the wafer transfer mechanism 125, another pod 110 is transferred from the pod shelf 105 onto the mounting table 122 of the other (lower or upper) pod opener 121 by the pod transfer 118. Simultaneously with the charging operation of the wafers 200, an operation of opening the pod 110 is performed by the pod opener 121. The empty pod 110 is transferred from the pod opener 121 to the pod shelf 105 and mounted on the pod shelf 105.

In this manner, the boat 217 is charged with the wafers so that the substrate processing process described above can be performed.

(Substrate Unloading Operation)

After performing the substrate processing process, a substrate unloading operation is performed in the reverse order of the substrate loading operation described above. As a result, the pod 110 containing the processed wafers 200 is unloaded to the lower load port 114 or the upper load port 160.

(Basic Use Mode)

The substrate processing apparatus 100 is provided with the lower load port 114 and the upper load port 160 as the load ports used for the substrate loading operation described above. In the present embodiment, the upper and lower load ports 114 and 160 are operated in the mode described below.

For example, during the so-called offline time when the substrate processing apparatus 100 does not need to be operated in conjunction with other apparatuses, the lower load port 114 is exclusively used. The substrate processing apparatus 100 is operated in a mode in which the operator manually supplies the pod 110 to the lower load port 114. On the other hand, for example, during the so-called online time when the substrate processing apparatus 100 needs to be operated in conjunction with other apparatuses, the upper load port 160 is exclusively used. The substrate processing apparatus 100 is operated in a mode in which an automatic transfer (not shown) supplies the pod 110 to the upper load port 160.

In other words, in the present embodiment, it is possible to selectively cope with offline time and online time. Each of the load port 114 and 160 is used properly according to the selection.

(Switching of Use Mode)

When operating the substrate processing apparatus 100 in such an operation, the shelf plates 117 of the pod shelf 105 may become insufficient in the substrate processing apparatus 100. For example, depending on the content of the substrate processing process, the wafers 200 should be loaded and unloaded into and out of a large number of pods 110 within the apparatus housing 111. In that case, there is a possibility that the shelf plates 117 for mounting the pods 110 are insufficient. If the shelf plates 117 of the pod shelf 105 are insufficient, the loading/unloading operation of the pods 110 may lead to a decrease in substrate processing efficiency.

Therefore, in the present embodiment, since there are upper and lower load ports 114 and 160, the use mode of the load ports 114 and 160 is switched so that at least one of the load ports 114 and 160 is used as a part of the pod shelf 105 to eliminate the shortage of the shelf plates of the pod shelf 105. For example, if two pods 110 (four pods 110 in total) are mounted on each of the load ports 114 and 160, the use mode is switched independently for each mounting location so that each of the four mounting locations can be individually used as the pot shelf 105. By switching the use mode in this way, it is possible to flexibly and appropriately cope with the increase or decrease in the number of pods 110 accommodated in the substrate processing apparatus 100.

Hereinafter, the switching of the use mode of the load ports 114 and 160 will be described with a specific example.

The switching of the use mode of the load ports 114 and 160 is performed under the operation control by the controller 280. The controller 280 is configured to switch the use mode of the load ports 114 and 160 based on apparatus commands which are used to instruct the operation of each part of the substrate processing apparatus 100. The format of the apparatus commands is not particularly limited, and the commands generally used in the controller 280 of the substrate processing apparatus 100 may be used.

The apparatus commands for switching the use mode of the load ports 114 and 160 can be set by, for example, the input/output device 281 as an operating part connected to the controller 280. However, the present disclosure is not necessarily limited thereto. For example, the apparatus commands may be set in the host computer 284 connected to the controller 280 via the external connector 283, and the use mode may be switched based on instructions from the host computer 284.

Figure 7:
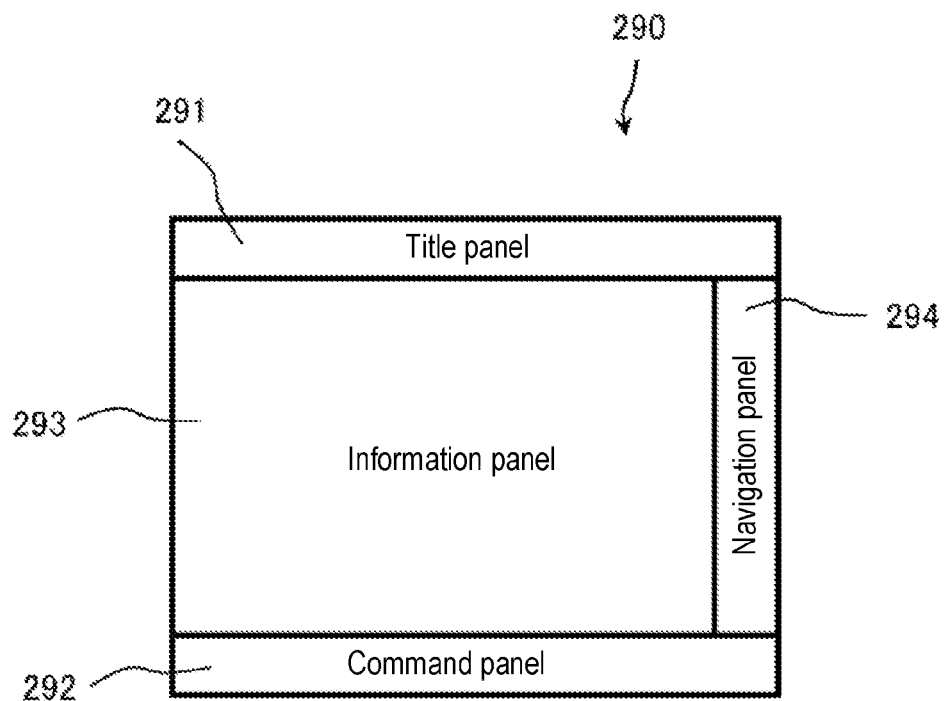
FIG. 7 is a schematic diagram showing a configuration example of an operation screen for setting apparatus commands for the substrate processing apparatus according to one embodiment of the present disclosure.

In either case, it is assumed that the apparatus commands are set on an operation screen. FIG. 7 is a schematic diagram showing a configuration example of the operation screen for setting the apparatus commands. As shown in FIG. 7, the operation screen 290 has its screen region divided into a plurality of panel divisions. The panel divisions include, for example, a title panel 291 for displaying a screen title, a time, and the like, a navigation panel 292 for displaying buttons for selecting work divisions, an information panel 293 for displaying different screens for each function, and a command panel 294 for displaying execution buttons for apparatus commands.

Figure 8A:
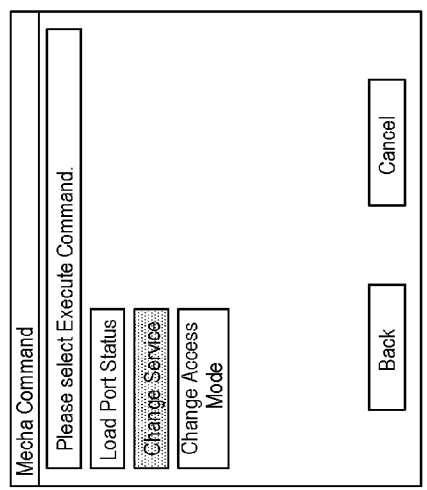
FIGS. 8A, 8B, 8C, and 8D are explanatory diagrams showing a procedure of a use mode switching operation of a load port of the substrate processing apparatus according to one embodiment of the present disclosure, where FIGS. 8A, 8B, 8C, and 8D schematically show display examples of the operation screen.
Figure 8B:
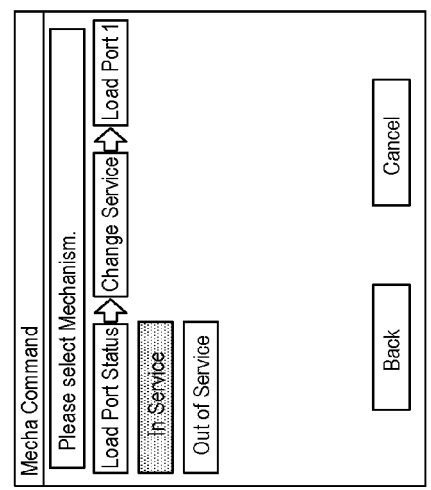
Figure 8C:
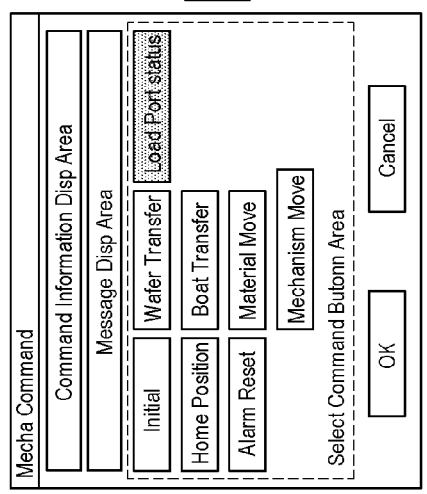
Figure 8D:
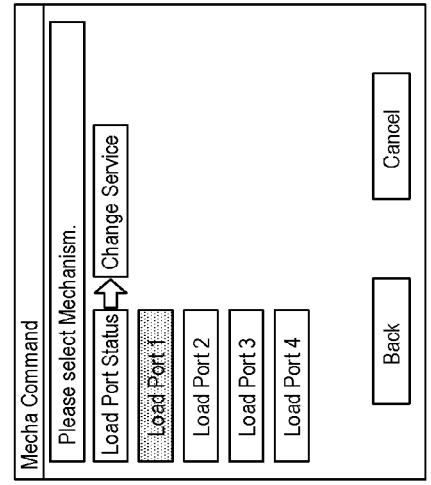

The use mode switching operation on the operation screen is performed, for example, according to the procedure described below. FIGS. 8A, 8B, 8C, and 8D are explanatory diagrams showing the procedure of the use mode switching operation for the load ports. In the use mode switching operation, a command information display area (Command Information Disp Area) shown in FIG. 8A is displayed on the operation screen. When the load port status (Load Port Status) icon is selected in this command information display area, the operation screen is switched to a command selection request (Please Select Execute Command) shown in FIG. 8B. When the service change (Change Service) icon is selected, the operation screen is switched to a mechanism selection request (Please Select Mechanism) shown in FIG. 8B, whereby the load port as a use mode switching target can be designated. The load port can be designated for each location where the pod 110 is placed (e.g., "load port 1" and "load port 2") in the case of the lower load port 114, and can also be similarly designated for each location where the pod 110 is placed (e.g., "load port 3" and "load port 4") even in the case of the upper load port 160. In other words, if the pods 110 are placed at a total of four locations, it is possible to switch the use mode independently for each of "load port 1" to "load port 4". As a result, for example, even when "load port 3" and "load port 4" of the load port 160 are used as the load ports, and "load port 1" and "load port 2" of the load port 114 are used as the mounting shelves, if the shelf plates of the pod shelves 105 are insufficient, one or all of the load ports 160 (either "load port 3" or "load port 4") can be used as a mounting shelf. Then, when one of the load ports is selected and designated, the operation screen is switched to a command selection request (Please Select Execute Command) shown in FIG. 8D. This makes it possible to designate whether to set in-service (In Service) or out-of-service (Out of Service) for the selected/designated load port.

When the selected/designated load port is selected and designated to be in service (In Service) after the use mode switching operation as described above, an apparatus command to that effect is sent to the controller 280. In response to the apparatus command, the controller 280 uses the selected/designated load port as a load port in the original use mode. On the other hand, if the selected/designated load port is selected and designated to be out of service (Out of Service) through the use mode switching operation as described above, an apparatus command to that effect is sent to the controller 280. In response to the apparatus command, the controller 280 switches the use mode of the selected/designated load port so that the selected/designated load port is not used as a load port but is used as a part of the pod shelf 105.

In other words, in the present embodiment, when the service status of the selected/designated load port is switched to Out of Service on the operation screen for instructing the switching of the service status of the load port, the controller 280 switches the use mode so that the load port is used as a part of the pod shelf 105. By switching the use mode in this manner, even if there is a possibility that the shelf plates 117 of the pod shelf 105 are insufficient, a part of the load port 114 or 160 can be used as a part of the pod shelf 105. Therefore, it is possible to solve the shortage of the shelf plates of the pod shelf 105, and it is possible to flexibly and appropriately cope with the increase or decrease in the number of pods 110 accommodated in the substrate processing apparatus 100. Moreover, by switching the use mode, the number of pods 110 accommodated in the pod shelf 105 can be substantially increased without changing (modifying) the hardware configuration of the substrate processing apparatus 100.

Such switching of the use mode is performed based on the apparatus command that the controller 280 instructs the apparatus operation. In other words, the switching function of the load port service state (In Service/Out of Service) of the apparatus command, which is an existing function of the substrate processing apparatus 100, is used to switch the use mode of the load port. Since the existing function of the substrate processing apparatus 100 is used, it is possible to suppress a large change (modification) of the software configuration of the substrate processing apparatus 100.

Further, by switching the use mode based on the apparatus command, the substrate processing apparatus 100 or the like may not be restarted in response to the switching of the use mode. In other words, the controller 280 switches the use mode of the load port without restarting the apparatus. Since the use mode of the load port can be switched without restarting the substrate processing apparatus 100 as described above, it is possible to eliminate a reset time for restarting the apparatus and resetting the related parameters.

In the present embodiment, the switching of the use mode of the load port can be performed on the operation screen of the input/output device 281 as an operator connected to the controller 280. Therefore, it is possible to switch the use mode of the load port by operating the input/output device 281, and the hardware configuration of the substrate processing apparatus 100 does not need to be significantly changed (modified).

However, the switching of the use mode of the load port may be performed based on an instruction from the host computer 284. That is, if a load port change request (Change Service Status) is received from the host computer 284, the use mode of the load port may be switched. In that case, it is possible to switch the use mode of the load port without operating the input/output device 281. Therefore, the switching of the use mode of the load port can be remotely managed in accordance with the operation of the host computer 284. As a result, the load port can be used without affecting the production.

(Erroneous Operation Prevention Operation)

As described above, in the present embodiment, it is possible to switch the use mode of each of the load ports 114 and 160. That is, each of the load ports 114 and 160 can be used as a load port or as a part of the pod shelf 105 individually for each mounting location of the pod 110.

If such switching of the use mode is possible, for example, even if the load port is used as a part of the pod shelf 105, there is a possibility that an operator may erroneously try to take out the pod 110 from the load port.

Therefore, in the present embodiment, in addition to being able to switch the use mode of the load ports 114 and 160, the erroneous operation prevention function part 280g gives an operation instruction via the controller 280 to each pod clamping mechanism 300 installed in each of the load ports 114 and 160 so as to execute an erroneous operation prevention operation according to the use mode. In other words, each pod clamping mechanism 300 functions as an erroneous operation prevention function part by executing an erroneous operation prevention operation for the pod 110 arranged on each of the load ports 114 and 160 while following the operation instruction from the controller 280.

Specifically, the pod clamping mechanism 300 performs the below-described processing operation as the erroneous operation prevention operation.

For example, in the case of a use mode in which either one of the load ports 114 and 160 is used as a part of the pod shelf 105, the state of the pod clamping mechanism 300 installed in the load port used as a part of the pod shelf 105 is converted into a container holding state (clamping state) in which the pod 110 mounted on the load port is held. More specifically, the clamping state is maintained in which the base 100a of the pod 110 mounted on the load port and the locking claw portion 301 of the pod clamping mechanism 300 are locked to each other. However, if the pod 110 is not mounted on the load port, the locking claw portion 301 of the pod clamping mechanism 300 may be rotated to bring the pod clamping mechanism 300 to an unclamping state.

Since the pod clamping mechanism 300 performs such an erroneous operation prevention operation, it is possible to prevent an operator from erroneously operating the load port used as a part of the pod shelf 105. For example, if the pod 110 is not mounted on the load port, the pod clamping mechanism 300 can be converted to the clamping state to prevent the pod 110 from being mounted on the load port by mistake. Further, for example, if the pod 110 is already mounted on the load port, the pod clamping mechanism 300 can be brought to the clamping state to prevent the pod 110 from being accidentally removed from the load port. In other words, even when the use mode of the load ports 114 and 160 is switched, the erroneous operation prevention operation of switching the clamping state and the unclamping state of the pod clamping mechanism 300 according to the use mode can be performed to prevent an operator's erroneous operation which may otherwise be caused by the switching operation.

Further, for example, in the case of a use mode in which the load ports 114 and 160 are used as load ports, the state of the pod clamping mechanism 300 is converted to a container non-holding state (unclamping state). More specifically, in principle, the locking claw portion 301 of the pod clamping mechanism 300 is rotated into the unclamping state so that the pod 110 can be supplied to or discharged from the load port 114 or 160. If the pod 110 is supplied and mounted, the pod clamping mechanism 300 is brought into the clamping state.

Due to such an erroneous operation prevention operation, in the case of a use mode in which the load ports 114 and 160 are used as load ports, the load ports 114 and 160 can be used as in the case of a substrate processing apparatus having a general configuration according to the existing technique.

(Emergency Response Operation in Case of Failure)

As described above, in the present embodiment, by switching the use mode of each of the load ports 114 and 160, it is possible to use one of the load ports 114 and 160 as a part of the pod shelf 105. That is, one of the load ports 114 and 160 is used as a part of the pod shelf 105 by switching the use mode, and the other is used as a load port.

In this case, if the load port comes into a failure state for a certain reason, the pod 110 cannot be transferred to and from the substrate processing apparatus 100, and the downtime of the substrate processing apparatus 100 may adversely affect the productivity of the substrate processing process.

Therefore, in the present embodiment, in addition to switching the use mode so that either one of the load ports 114 and 160 is used as a part of the pod shelf 105, the use mode is switched so that recovery can be performed in the event of a load port failure. Specifically, as the recovery in the event of a load port failure, the controller 280 recognizes the presence or absence of a failure state of the load ports 114 and 160 (particularly, a failure state of the load port used as a load port). According to the recognition result, the controller 280 switches the use mode of the load ports 114 and 160 so that another load port can be used as a substitute for the load port that has come into a failure state.

The controller 280 continuously monitors the states of the load ports 114 and 160 during the operation of the substrate processing apparatus 100 so that the failure of the load ports 114 and 160 can be detected. The state monitoring may be performed using known techniques, such as using the sensor detection results or monitoring the response time of an apparatus command. Then, from the result of the state monitoring, it is recognized whether or not one of the load ports 114 and 160 used as a load port is in a failure state.

As a result, when there is a load port recognized as being in a failure state, the controller 280 switches the use mode of the load port 114 or 160 so that the function of that load port is replaced by another load port. Specifically, while stopping the use of the load port having the failure state, the pod clamping mechanism 300 of another load port already used as a part of the pod shelf 105 is brought into the unclamping state to remove the pod 110 from another load port. Further, the service state of another load port is switched to in service (In Service) so that another load port can be used as a substitute for the load port having the failure state.

In this way, if there is a load port having a failure state, the use mode is switched so that another load port is used as a substitute for the load port having the failure state. Therefore, even if a load port fails, by merely changing the state of the load port used as a part of the pod shelf 105, the load port can be used as a substitute for the load port having the failure state. As a result, it is possible to contribute to shortening the downtime of the substrate processing apparatus 100 and to suppress adverse effects on the productivity of the substrate processing process.

(7) Effects of the Embodiment

According to the present embodiment, one or more of the following effects may be achieved.

(a) According to the present embodiment, the use mode of each of the load ports 114 and 160 can be switched so that the pod mounting location of at least one of the load ports 114 and 160 is used as a part of the pod shelf 105. Therefore, even if there is a possibility that the shelf plates 117 of the pod shelf 105 may run short, the shortage of the shelf plates of the pod shelf 105 can be resolved by switching the use mode of each of the load ports 114 and 160. Moreover, since the shortage of the shelf plates is resolved by switching the use mode, it is possible to substantially increase the number of pods 110 that can be accommodated, without changing (modifying) the hardware configuration of the substrate processing apparatus 100.

Furthermore, according to the present embodiment, the erroneous operation prevention operation of switching the clamping state and the unclamping state of the pod clamping mechanism 300 is executed according to the use mode of each of the load ports 114 and 160. Therefore, even if the use mode of each of the load ports 114 and 160 is switched, it is possible to prevent an operator's erroneous operation which may otherwise be cause by the switching.

That is, according to the present embodiment, it is possible to flexibly and appropriately cope with an increase or decrease in the number of pods 110 accommodated in the substrate processing apparatus 100.

(b) According to the present embodiment, the switching of the use mode of each of the load ports 114 and 160 is performed based on the apparatus command instructing an apparatus operation. In other words, the switching function of the load port service states (In Service and Out of Service) of the apparatus command, which is an existing function of the substrate processing apparatus 100, is used to switch the use mode of the load port. Therefore, even if coping with the switching of the use mode of each of the load ports 114 and 160, it is possible to prevent the software configuration of the substrate processing apparatus 100 from being significantly changed (modified).

(c) According to the present embodiment, the use mode of each of the load ports 114 and 160 can be switched without restarting the substrate processing apparatus 100. Therefore, even when coping with the switching of the use mode of each of the load ports 114 and 160, the restarting time for restarting the apparatus and the reset time for resetting the related parameters can be eliminated.

(d) According to the present embodiment, the state of the pod clamping mechanism 300 is converted to the container holding state (clamping state) in the case of the use mode in which one of the load ports 114 and 160 is used as a part of the pod shelf 105. Therefore, it is possible to prevent an operator from erroneously mounting the pod 110 on the load port or removing the mounted pod 110.

(e) According to the present embodiment, in the case of the use mode in which the load ports 114 and 160 are used as load ports, the state of the pod clamping mechanism 300 is converted into the container non-holding state (unclamping state). Therefore, in such a use mode, the load ports 114 and 160 can be used in the same manner as in the substrate processing apparatus having the general configuration according to the existing technique.

(f) According to the present embodiment, the switching of the use mode of each of the load ports 114 and 160 can be performed on the operation screen of the input/output device 281 as an operator connected to the controller 280. Therefore, it is possible to switch the use mode of each of the load ports 114 and 160 by merely operating the input/output device 281. The hardware configuration of the substrate processing apparatus 100 does not need to be significantly changed (modified).

(g) According to the present embodiment, it is possible to switch the use mode of each of the load ports 114 and 160 based on the instruction from the host computer 284 connected via the external connector 283. In that case, the use mode of each of the load ports 114 and 160 can be switched without requiring an operation on the input/output device 281. Therefore, the switching of the use mode of each of the load ports 114 and 160 can be remotely managed in accordance with the operation of the host computer 284. As a result, each of the load ports 114 and 160 can be used without affecting the production.

(h) According to the present embodiment, the presence or absence of a failure state of the load ports 114 and 160 is recognized. If there is a load port having a failure state, the use mode is switched so that another load port can be used as a substitute. Therefore, even if a load port fails, the load port used as a part of the pod shelf 105 can be used as a substitute for the failed load port by merely converting the state of the load port used as a part of the pod shelf 105. As a result, it is possible to contribute to shortening the downtime of the substrate processing apparatus 100 and to suppress adverse effects on the productivity of the substrate processing process.

(8) Modifications

Although the embodiment of the present disclosure has been specifically described above, the present disclosure is not limited to the above-described embodiment, and various modifications may be made without departing from the spirit of the present disclosure.

For example, in the above-described embodiment, the film-forming process was taken as an example of the substrate processing process, but the present disclosure is not limited thereto. That is, in the present disclosure, the specific content of the substrate processing process does not matter. The present disclosure can be applied not only to the film-forming process but also to other substrate processing processes such as an annealing process, a diffusion process, an oxidation process, a nitriding process, a lithography process, and the like. Furthermore, the present disclosure is applicable to other substrate processing apparatuses such as an annealing apparatus, an etching apparatus, an oxidation apparatus, a nitriding apparatus, an exposure apparatus, a coating apparatus, a drying apparatus, a heating apparatus, a processing apparatus using plasma, and the like. In addition, the present disclosure may be applied to a combination of these apparatuses. Moreover, it is also possible to add another configuration to the configurations of the embodiment, delete some of the configurations of the embodiment, or replace the configuration of the embodiment with another configuration.

According to the present disclosure in some embodiments, it is possible to flexibly and appropriately cope with a change in the storage number of substrate storage containers.

While certain embodiments have been described, these embodiments have been presented by way of example, and are not intended to limit the scope of the disclosures. Indeed, the embodiments described herein may be embodied in a variety of other forms. Furthermore, various omissions, substitutions, and changes in the form of the embodiments described herein may be made without departing from the spirit of the disclosures. The accompanying claims and their equivalents are intended to cover such forms or modifications as would fall within the scope and spirit of the disclosures.

The invention claimed is:

1. A substrate processing apparatus, comprising:
at least one load port capable of mounting a substrate storage container that stores a substrate;
a pod clamping mechanism including locking claw portions to lock the substrate storage container;
a controller configured to be capable of performing:
a switching control to switch a function of the at least one load port between a first function of mounting the substrate storage container on the at least one load port and then transporting the substrate storage container to a pod shelf and a second function of mounting the substrate storage container on the at least one load port without transporting the substrate storage container to the pod shelf; and
an erroneous operation prevention control to execute an erroneous operation prevention operation to the substrate storage container arranged on the at least one load port by converting a state of the pod clamping mechanism between a holding state and a non-holding state according to the switching control switching between the first function and the second function,
wherein in the holding state of the pod clamping mechanism, the locking claw portions lock the substrate storage container mounted on the at least one load port, and in the non-holding state of the pod clamping mechanism, the locking claw portions unlock the substrate storage container mounted on the at least one load port,
wherein the state of the pod clamping mechanism is converted to the non-holding state if the at least one load port is performing the first function, and the state of the pod clamping mechanism is converted to the holding state if the at least one load port is performing the second function; and
a process chamber configured to process the substrate.

2. The apparatus of claim 1, wherein the controller is configured to perform the switching control based on an apparatus command for instructing an apparatus operation.

3. The apparatus of claim 2, wherein the controller is configured to perform the switching control without having to restart the apparatus.

4. The apparatus of claim 1, wherein the controller is configured to be capable of performing the erroneous operation prevention control to convert the state of the pod clamping mechanism to the non-holding state if the substrate storage container is mounted on the at least one load port when performing the second function.

5. The apparatus of claim 1, wherein the controller is configured to be capable of performing the erroneous operation prevention control to convert the state of the pod clamping mechanism to the holding state if the substrate storage container is mounted on the at least one load port when performing the first function.

6. The apparatus of claim 1, further comprising:
an operator configured to set an apparatus command, and
wherein the controller is configured to perform the switching control based on the apparatus command set by the operator.

7. The apparatus of claim 6, wherein the at least one load port comprises a plurality of load ports, and
wherein the operator is configured to set one of performing the first function and performing the second function for at least one of the plurality of load ports.

8. The apparatus of claim 1, further comprising an external connector connected to a host apparatus, and
wherein the controller is configured to perform the switching control based on an instruction from the host apparatus connected to the external connector.

9. The apparatus of claim 1, wherein the at least one load port comprises a plurality of load ports, and
wherein the controller is configured to recognize whether or not the plurality of load ports are in a failure state, and perform the switching control so that another load port is used as a substitute for a specific load port in the failure state.

10. A switching method, comprising:
mounting a substrate storage container that stores a substrate on at least one load port;
switching a function of the at least one load port between a first function of mounting the substrate storage container on the at least one load port and then transporting the substrate storage container to a pod shelf and a second function of mounting the substrate storage container on the at least one load port without transporting the substrate storage container to the pod shelf; and
executing an erroneous operation prevention operation to the substrate storage container arranged on the at least one load port by converting a state of a pod clamping, which includes locking claw portions to lock the substrate storage container, mechanism between a holding state and a non-holding state according to a switching control switching between the first function and the second function,
wherein in the holding state of the pod clamping mechanism, the locking claw portions lock the substrate storage container mounted on the at least one load port, and in the non-holding state of the pod clamping mechanism, the locking claw portions unlock the substrate storage container mounted on the at least one load port,
wherein the state of the pod clamping mechanism is converted to the non-holding state if the at least one load port is performing the first function, and the state of the pod clamping mechanism is converted to the holding state if the at least one load port is performing the second function.

11. A method of manufacturing a semiconductor device, comprising: the switching method of claim 10; and
processing the substrate.

12. A non-transitory computer-readable recording medium storing a program that causes, by a computer, a substrate processing apparatus to perform a process comprising:
mounting a substrate storage container that stores a substrate on at least one load port;
switching a function of the at least one load port between a first function of mounting the substrate storage container on the at least one load port and then transporting the substrate storage container to a pod shelf and a second function of mounting the substrate storage container on the at least one load port without transporting the substrate storage container to the pod shelf;
executing an erroneous operation prevention operation to the substrate storage container arranged on the at least one load port by converting a state of a pod clamping mechanism, which includes locking claw portions to lock the substrate storage container, between a holding state and a non-holding state according to a switching control switching between the first function and the second function,
wherein in the holding state of the pod clamping mechanism, the locking claw portions lock the substrate storage container mounted on the at least one load port, and in the non-holding state of the pod clamping mechanism, the locking claw portions unlock the substrate storage container mounted on the at least one load port,
wherein the state of the pod clamping mechanism is converted to the non-holding state if the at least one load port is performing the first function, and the state of the pod clamping mechanism is converted to the holding state if the at least one load port is performing the second function; and
processing the substrate.

* * * * *